US009178618B2

(12) United States Patent
DeCusatis et al.

(10) Patent No.: US 9,178,618 B2
(45) Date of Patent: Nov. 3, 2015

(54) PREASSEMBLED OPTOELECTRONIC INTERCONNECT STRUCTURE

(71) Applicant: INTERNATIONAL BUSINESS MACHINES CORPORATION, Armonk, NY (US)

(72) Inventors: Casimer M. DeCusatis, Poughkeepsie, NY (US); Rajaram B. Krishnamurthy, Wappingers Falls, NY (US); Michael Onghena, Poughquag, NY (US); Anuradha Rao, Hopewell Junction, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 37 days.

(21) Appl. No.: 14/059,555

(22) Filed: Oct. 22, 2013

(65) Prior Publication Data

US 2015/0110496 A1  Apr. 23, 2015

(51) Int. Cl.
| | |
|---|---|
| *G02B 6/36* | (2006.01) |
| *H04B 10/10* | (2006.01) |
| *H04B 10/2575* | (2013.01) |
| *H04B 10/25* | (2013.01) |
| *G02B 6/00* | (2006.01) |
| *H01L 21/00* | (2006.01) |
| *H05K 1/18* | (2006.01) |

(52) U.S. Cl.
CPC ............ *H04B 10/2575* (2013.01); *G02B 6/00* (2013.01); *H01L 21/00* (2013.01); *H04B 10/2504* (2013.01); *H05K 1/181* (2013.01); *H05K 2201/10515* (2013.01)

(58) Field of Classification Search
USPC ............................................... 385/1; 398/131
See application file for complete search history.

(56) References Cited

U.S. PATENT DOCUMENTS

| | | |
|---|---|---|
| 6,195,485 B1 | 2/2001 | Coldren et al. |
| 6,574,398 B2 | 6/2003 | Coldren et al. |
| 6,993,243 B2 | 1/2006 | Delwala |
| 7,010,192 B2 | 3/2006 | Joo et al. |
| 7,046,895 B1 | 5/2006 | Gunn, III et al. |
| 7,046,896 B1 | 5/2006 | Gunn, III et al. |
| 2004/0208439 A1 | 10/2004 | Bell et al. |

(Continued)

FOREIGN PATENT DOCUMENTS

CN           101499606 A       8/2009

*Primary Examiner* — Eric Wong
(74) *Attorney, Agent, or Firm* — Kevin P. Radigan, Esq.; Heslin Rothenberg Farley & Mesiti P.C.

(57) ABSTRACT

An interconnect component is provided fabricated as a pre-assembled optoelectronic interconnect structure. The interconnect structure has an optical waveguide link with first and second optoelectronic circuits attached to first and second ends of the waveguide link. The optoelectronic circuits include active optical componentry which facilitates optical signal communication across the optical waveguide link. Further, first and second pluralities of electrical contacts are associated with the first and second optoelectronic circuits, respectively, to facilitate electrically, operatively connecting the interconnect structure between first and second components of an electronic assembly as, for instance, a single, field-replaceable unit. The first and second components of the electronic assembly may be, for instance, stacked electronic components of the electronic assembly, or laterally offset components of a substantially planar electronic assembly.

15 Claims, 9 Drawing Sheets

(56) References Cited

U.S. PATENT DOCUMENTS

2007/0019917 A1    1/2007   Bayindir et al.
2014/0270784 A1*   9/2014   Thacker et al. ............... 398/115

\* cited by examiner

PREASSEMBLED OPTOELECTRONIC INTERCONNECT STRUCTURE

BACKGROUND

As density of circuits, such as multi-core, application-specific integrated circuits (ASICs), continues to increase, many designers are working towards three-dimensional (3-D) stacked chip technology as an emerging trend in the industry. One reason for this work is the decreasing size of transistors, which allows for more components to be placed within the same chip footprint. As this happens, the relative distance between components grows larger. For example, consider two 1 µm transistors connected by 1 mm of wiring. A signal that travels from one device to the other will cross a distance equivalent to 1000 transistor lengths. If, however, the size of the transistors decreases to, for instance, 1 nm, but the separation between components remains the same, then the distance now equates to 1,000,000 transistor lengths between the two components. The signal thus needs to travel several orders of magnitude further in terms of relative component scale. Despite several techniques proposed to shorten wiring length connecting remote parts of a same chip, problems of wiring density and limited number of escape routes continue to exist. This has led to the concept of three-dimensional chip stacking or vertical integration of chips or components. For instance, if a central processing unit (CPU) floating point unit and register file are relatively far apart from each other on a chip or die, it is possible to locate the floating point unit within a separate die, and place this separate die directly over the die containing the register file, and thus replace a long horizontal distance between components with a relatively short vertical distance.

A significant issue remaining with a vertical integration approach is the limited number of wiring escapes, for example, in a three-dimensional stacked configuration. A parallel electrical data bus is usually required to produce enough bandwidth without increasing the data rate of a single line beyond acceptable limits for electromagnetic noise. However, it can be challenging to interconnect multiple three-dimensional layers with a parallel electrical data bus that has properly equalized lines.

BRIEF SUMMARY

The shortcomings of the prior art are overcome, and additional advantages are provided through the provision, in one aspect, of an interconnect component which comprises a preassembled optoelectronic interconnect structure. The preassembled optoelectronic interconnect structure includes: an optical waveguide link having a first end and a second end; a first optoelectronic circuit attached to the first end of the optical waveguide link, and a second optoelectronic circuit attached to the second end of the optical waveguide link, the first and second optoelectronic circuits comprising active optical componentry facilitating, in part, optical signal communication across the optical waveguide link; and a first plurality of electrical contacts associated with the first optoelectronic circuit and a second plurality of electrical contacts associated with the second optoelectronic circuit, the first and second pluralities of electrical contacts facilitating electrically operatively connecting the preassembled optoelectronic circuit structure between first and second components of an electronic assembly.

In another aspect, an electronic assembly is provided which includes a first component, a second component, and a preassembled optoelectronic interconnect structure electrically connected between the first and second components of the electronic assembly. The preassembled optoelectronic interconnect structure includes: an optical waveguide link having a first end and a second end; a first optoelectronic circuit attached to the fist end of the optical waveguide link, and a second optoelectronic circuit attached to a second end of the optical waveguide link, the first and second optoelectronic circuits comprising active optical componentry facilitating, in part, optical signal communication across the optical waveguide link; and a first plurality of electrical contacts associated with the first optoelectronic circuit and a second plurality of electrical contacts associated with the second optoelectronic circuit, the first and second pluralities of electrical contacts electrically connecting the preassembled optoelectronic interconnect structure between the first and second components of the electronic assembly.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
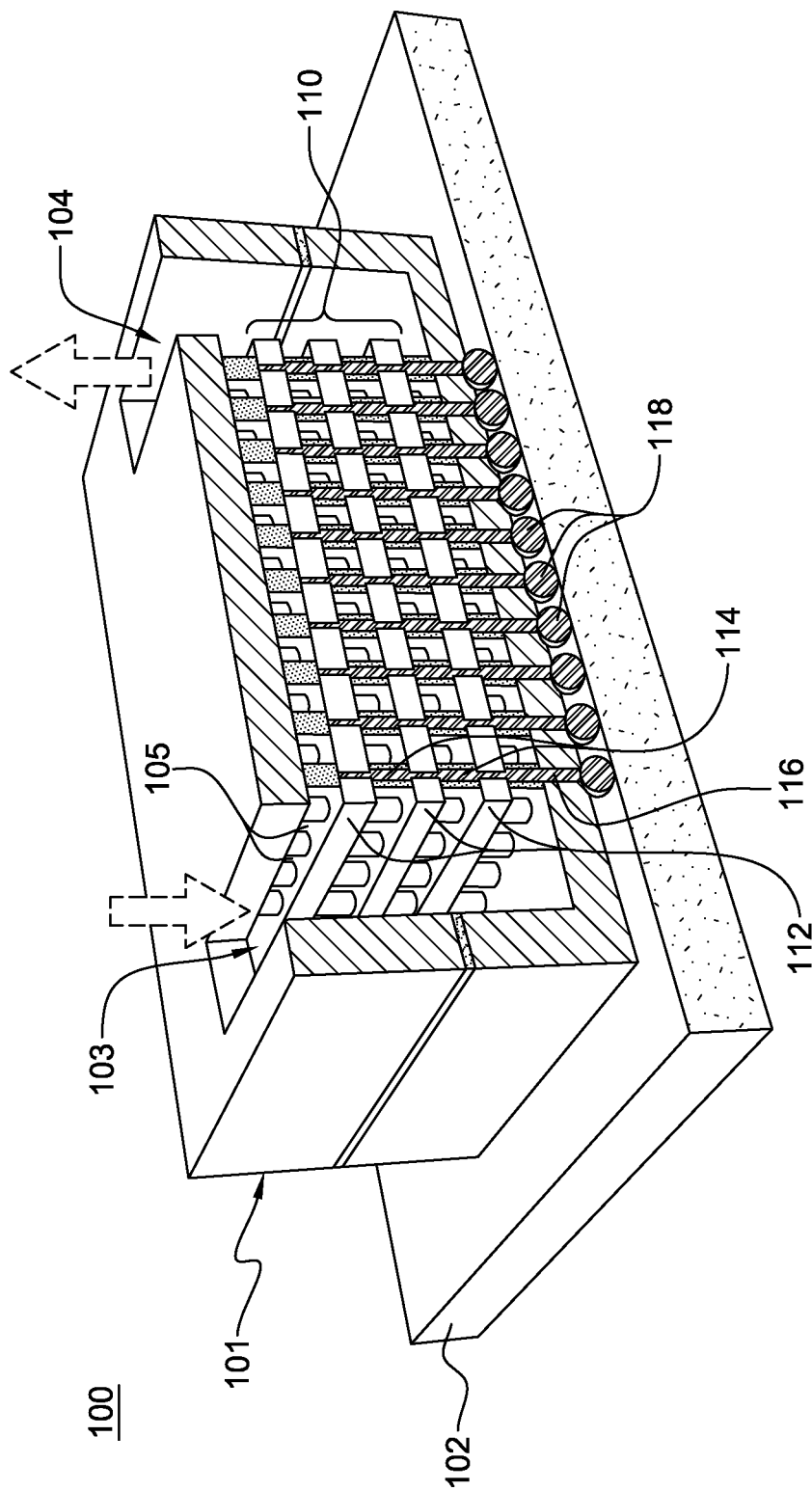
FIG. 1 is a partially cut-away isometric view of one embodiment of a three-dimensional electronic assembly comprising multiple stacked components (such as integrated circuit chips) electrically interconnected vertically, and which may employ one or more interconnect components, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc, are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure. Note also that reference is made below to the drawings, which are not drawn to scale for ease of understanding, wherein the same or similar reference numbers used throughout different figures designate the same or similar components.

As noted, one design issue of a three-dimensional electronic assembly packaging approach is the limited number of wiring escapes between layers. Typically, a parallel data bus is required to produce enough bandwidth without increasing the data rate of a single line beyond acceptable limits of electromagnetic noise. This makes it challenging to electrically interconnect multiple three-dimensional chip layers with one or more parallel buses with have properly equalized lines. One possible solution to this issue is to integrate optical waveguides in future three-dimensional electronic assemblies. However, such an approach requires significant changes in the fabrication processes and/or materials used, since optical waveguide fabrication is typically not compatible with electronic processing methods. A related problem occurs with dense printed circuit boards or backplanes which interconnect, for instance, multiple, high-performance, application-specific integrated circuit chips. It would be desirable to take advantage of an optical waveguide's performance, without the process or material restrictions inherent in optical waveguide fabrication commensurate with electronic circuit fabrication.

Generally stated, disclosed herein in one aspect, is an interconnect component which includes a preassembled optoelectronic interconnect structure. In one embodiment, this interconnect component includes an active optical waveguide and may be employed for dense printed circuit board assemblies, as well as three-dimensional stacked assemblies, such as three-dimensional, stacked application-specific circuit chips. Rather than an interconnect approach which attaches a laser source to a chip or die at one end of the link and a photo-detector at the other end, then deposits a layer of optical waveguide material between then, disclosed herein is a self-contained, preassembled optoelectronic interconnect structure which contains, in one embodiment, all of the active components within the end points of the interconnect structure, for instance, within first and second optoelectronic circuits attached to first and second ends of the optical waveguide link of the interconnect structure. The active optical componentry facilitates optical signal communication across the optical waveguide link between the first and second optoelectronic circuits (e.g., between one or more light sources and one or more photo-detectors). Additionally, the interconnect component includes a first plurality of electrical contacts associated with the first optoelectronic circuit and a second plurality of electrical contacts associated with the second optoelectronic circuit. These first and second pluralities of electrical contacts facilitate electrically, operatively connecting the preassembled optoelectronic interconnect structure between first and second components of an electronic assembly. In this manner, an electrical designer only handles or processes the conventional bonding pads on the card(s) or die(s), with the interconnect component (comprising the active optical waveguide) being later attached without interfering with any existing electronic structure fabrication steps.

The above-summarized approach offers several advantages. In addition to simplifying the integration of optical waveguides with card or die fabrication or packaging, it allows the integration of optical materials which may not be compatible with the electronic component design processes. For instance, electronic cards may be exposed to elevated temperatures during fabrication, which could affect operation of lasers, photo-diodes, waveguide materials, etc., possibly rendering them inoperable. Also, an optical waveguide is inherently immune to electromagnetic interference, does not radiate electromagnetic noise, and is lead-free. This allows considerable design freedom on the placement of such components. The preassembled active waveguides or interconnects disclosed herein are economical to manufacture in volume since fabrication may be based on or use semiconductor batch processing fabrication approaches. Additionally, the interconnect components disclosed may be employed to provide further escapes for dense wiring designs, without compromising the need for high bandwidth. This is contrasted with electrical bus interconnects, which emit more noise and consume more space as their bandwidth increases.

By way of example, FIG. 1 depicts one embodiment of a three-dimensional electronic assembly 100 comprising multiple stacked integrated circuit chips or die 112 disposed within an enclosure 101 configured with a coolant inlet manifold 103 and a coolant outlet manifold 104, and a plurality of coolant flow channels 105 disposed between the stacked integrated circuit chips 112. As illustrated, the plurality of coolant flow channels 105 couple in fluid communication coolant inlet manifold 103 and coolant outlet manifold 104 so that a liquid coolant (such as water, an aqueous-based solution, etc.) flows through enclosure 101 and facilitates removal of heat dissipated by the operating, stacked integrated circuit chips 112.

In this example, a plurality of electrical interconnect structures 114 electrically vertically connect the multiple stacked integrated circuit chips 112 together, and a plurality of vertical interconnects 116 electrically connect the stack of integrated circuit chips 112 with, for instance, a substrate or printed circuit board 102 via, for example, multiple solder bump interconnects 118. As noted, and issue with a configuration such as depicted in FIG. 1 is the limited space available for vertical electrical interconnecting of the stacked integrated circuit chips 112, both between chips and to the substrate 102.

Figure 2A:
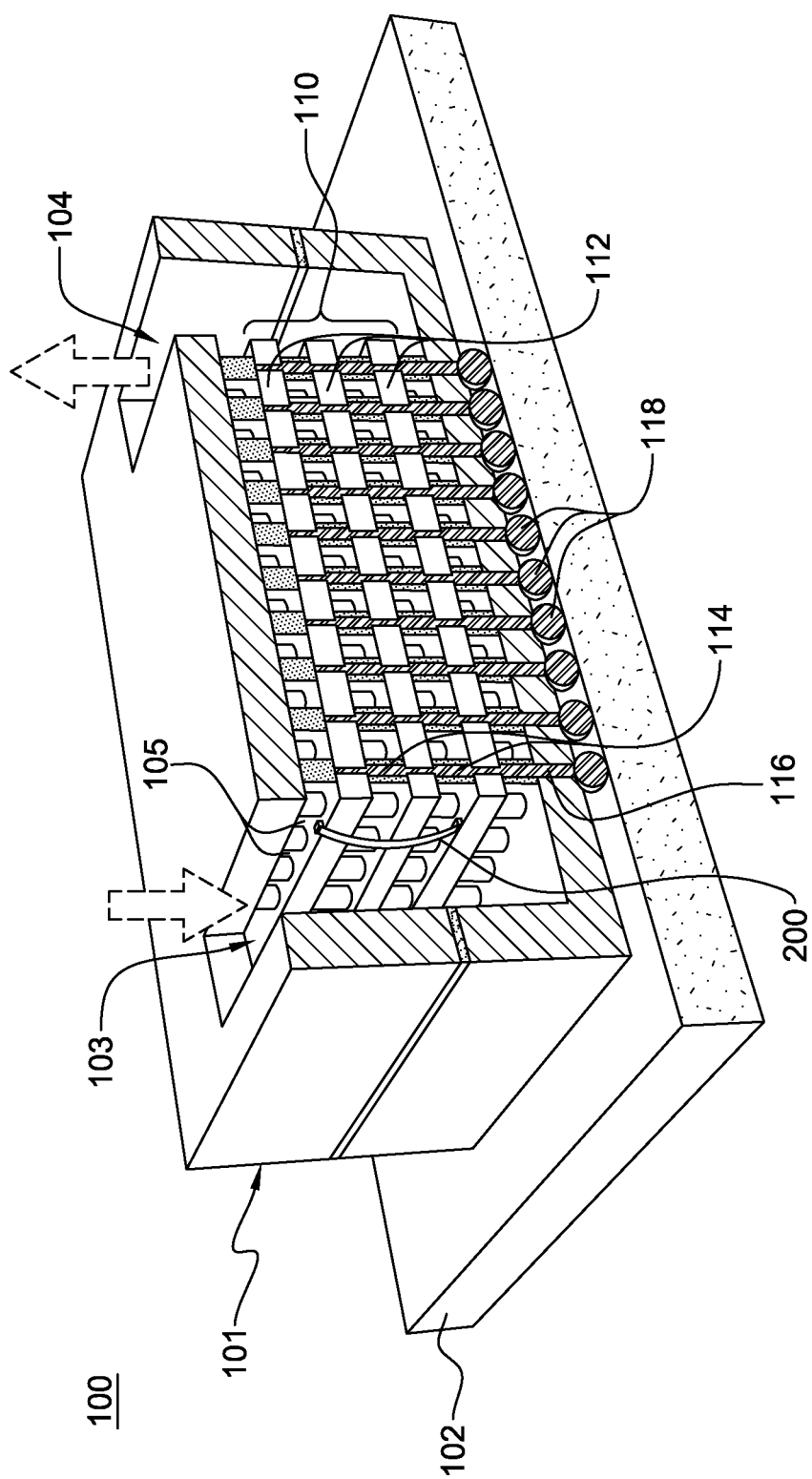
FIG. 2A depicts the three-dimensional electronic assembly of FIG. 1, with an interconnect component disposed, at least partially, along an edge thereof, in accordance with one or more aspects of the present invention.

FIG. 2A depicts one embodiment of a solution to this vertical integration interconnect issue. In this approach, an interconnect structure 200 is provided optoelectronically interconnecting two or more of the stacked integrated circuit chips 112 of the three-dimensional electronic assembly 100'. A schematic illustration of interconnect component 200 is depicted in FIG. 2B.

Figure 2B:
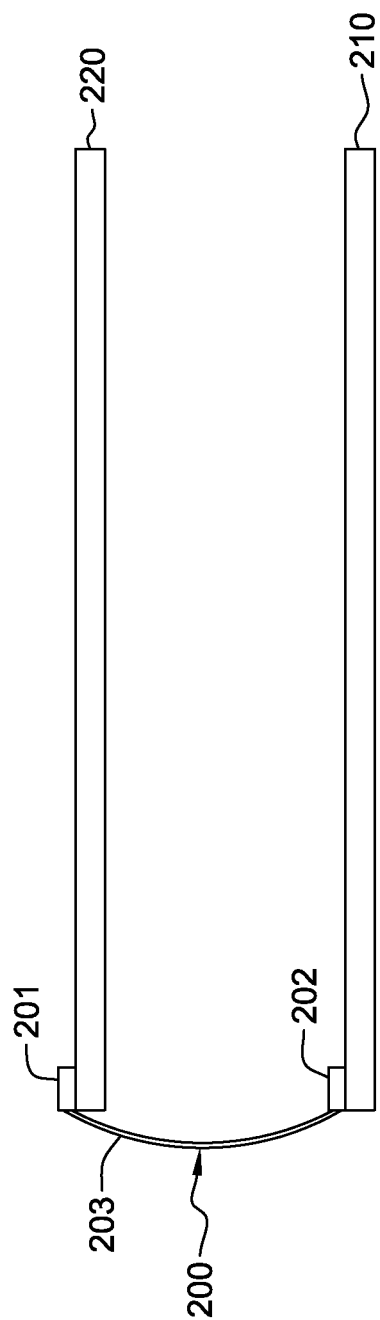
FIG. 2B is a simplified schematic of one embodiment of an interconnect component electrically connected to first and second components (in different layers or planes) of a three-dimensional electronic assembly, in accordance with one or more aspects of the present invention.

As shown in FIG. 2B, in one embodiment, interconnect component 200 includes a first optoelectronic circuit 201 attached to a first end of an optical waveguide link 203, and a second optoelectronic circuit 202 attached to a second end of optical waveguide link 203. In one embodiment, the first and second optoelectronic circuits are permanently physically attached to the first and second ends of the optical waveguide link in an assembly process before the interconnect component is brought into contact with the three-dimensional electronic assembly. Although not shown, the first and second optoelectronic circuits include or have associated therewith first and second pluralities of electrical contacts. These first and second pluralities of electrical contacts facilitate electrically operatively connecting the interconnect component, comprising the preassembled optoelectronic interconnect structure, between first and second components of an electronic assembly. In one example, the first and second components of the electronic assembly are first and second integrated circuit chips or dies 210, 220 of a three-dimensional electronic assembly. In another example, the first and second components may comprise any components of an electronic assembly, such as first and second electrical buses of the electronic assembly. Further, the electronic assembly, in an alternate configuration, may be a substantially planar assembly, such as a printed circuit board, upon or within which the first and second components to be connected reside.

Note again from the discussion provided herein that the interconnect component is a preassembled optoelectronic interconnect structure that operatively electrically interconnects between the first and second components of the electronic assembly, and within the component, actively converts received electrical signals into optical signals for transmission across the optical waveguide link, and reconverts the optical signals back to electrical signals for forwarding to the second component of the electronic assembly. Advantageously, in one embodiment, the interconnect component is fully preassembled, and is installable as a single component into the electronic assembly. In a further embodiment, the interconnect component may be a single field-replaceable unit of the electronic assembly.

Figure 3A:
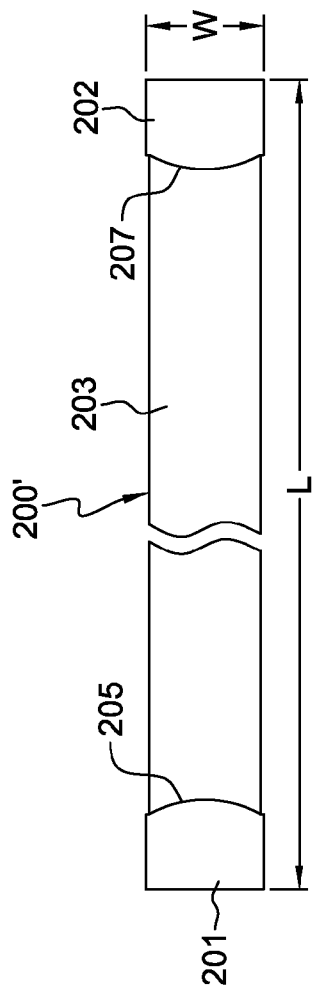
FIG. 3A depicts one embodiment of an interconnect component comprising a preassembled optoelectronic interconnect structure, in accordance with one or more aspects of the present invention.

FIG. 3A illustrates a plan view of another embodiment of an interconnect component 200', in accordance with one or more aspects of the present invention. Interconnect component 200' is similar to interconnect component 200, and may be employed in a three-dimensional electronic assembly, or in a planar electronic assembly, by way of example only. In this embodiment, interconnect component 200' includes a first optoelectronic circuit 201 attached to a first end 205 of an optical waveguide link 203, and a second optoelectronic circuit 202 attached to a second end 207 of the optical waveguide link 203. As noted, the first and second optoelectronic circuits include active optical componentry which facilitates, in part, optical signal communication across the optical waveguide link. In one embodiment, interconnect component 200' is fully preassembled prior to placement within the electronic assembly. Further, in one embodiment, signal communication may be unidirectional through the interconnect component from, for instance, first optoelectronic circuit to second optoelectronic circuit. In another embodiment, the optoelectronic circuits could be configured, and multiple optical waveguides provided, to allow for bidirectional communication. In the examples described hereinbelow, it is assumed that unidirectional communication is implemented via the interconnect component.

In one example, the optical waveguide link 203 may have a length 'L' of 100 cm or less, for instance, a length in the range of 20-40 cm for today's electronic assemblies, and a width 'W' in the range of 1-5 mm. The first optoelectronic circuit may include an array of light sources, such as an array of lasers. For instance, 12, 16, or more vertical-cavity, surface-emitting lasers (VCSELs) may be employed to drive optical signals across a corresponding number of optical waveguides within optical waveguide link 203. Second optoelectronic circuit 202 includes, in one embodiment, an array of photodiodes and associated signal processing circuits, each associated with a respective optical waveguide or channel of the optical waveguide link 203. Note that any desired number of optical waveguides could be provided within optical waveguide link 203 from, for instance, a single optical waveguide to 16, or more, optical waveguides. In one embodiment, the first and second optoelectronic circuits may include X-Y footprint in the 1-10 mm per direction range to facilitate their integration with or connection to the first and second components of the electronic assembly to be interconnected via the interconnect component 200'.

In other examples, the interconnect component may comprise an active optical waveguide for, for instance, a peripheral component interconnect (PCI) bus extension in a stacked electronic assembly. Further, multiple such interconnect components may be provided within the electronic assembly. Per channel or optical waveguide data rates of 10 gigabits/s or more are achievable using a preassembled optoelectronic interconnect structure such as disclosed herein. Further, the structure consumes low power of, for instance, 0.1 W per optoelectronic circuit, or less. Noise, radiation, and thermal dissipation is limited to the optoelectronic circuits at the end points of the waveguide link, which are more easily shielded and may be outfitted with optional heat spreaders. Further, since the optical waveguide link allows relatively long interconnect lengths without noise considerations, the end points could be located at points on the components (e.g., chips or die), with lower power dissipation.

FIGS. 3B-3E depict various enhancements or optional structures which may be integrated with the interconnect component disclosed herein.

Figure 3B:
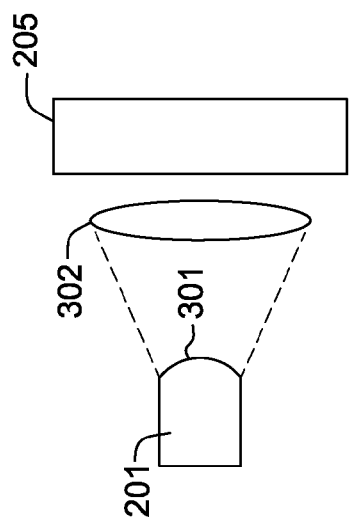
FIG. 3B is a schematic illustrating light source coupling from a vertical-cavity, surface-emitting laser (VCSEL) into an end of an optical waveguide of an interconnect component, in accordance with one or more aspects of the present invention.

For instance, FIGS. 3A & 3B depict that the first and second optoelectronic circuits are placed in very close proximity to the first and second ends of the optical waveguide link 203. In one embodiment, these circuits are permanently attached to the ends of the optical waveguide link. Advantageously, the end faces of the optical waveguides in the optical waveguide link may be configured and sized in order to enhance optically coupling (or capturing) of the optical signal being transmitted into or received from the respective optical waveguide. This optical coupling allows lower signal strengths to be employed, and avoids back reflections which could produce, for instance, laser noise. A typical optical waveguide loss may be about 3 dB per centimeter, and therefore, the active waveguides discussed herein can span distances of tens of centimeters using, for instance, existing VCSEL laser technology.

In FIG. 3B, first optoelectronic circuit 201 is shown as including one or more lasers 301, such as one or more VCSEL lasers. The VCSEL laser has an elliptical launch profile 302, and thus, in one embodiment, the first end 205 is configured with a shape and size that optimizes optical power coupling. For instance, the optical waveguide end face may be curved and have an aspect ratio designed to match, for instance, the VCSEL overfill launch. In one embodiment, the optical fiber end face may have, for instance, a curved, rectangular-shape and be sized to substantially fully capture the VCSEL overfill launch of the optical signal.

Figure 3C:
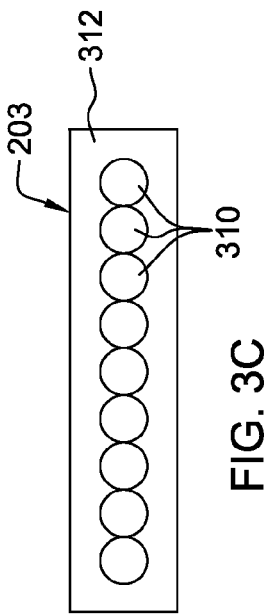
FIG. 3C is a transverse cross-sectional elevational view of one embodiment of an optical waveguide link of an interconnect component, in accordance with one or more aspects of the present invention.
Figure 3D:
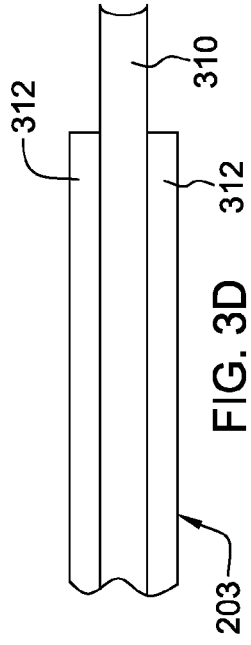
FIG. 3D is a partial longitudinal cross-sectional view of a single optical waveguide of an optical waveguide link of an interconnect component, in accordance with one or more aspects of the present invention.

FIG. 3C illustrates another aspect of an optical waveguide link 203, in accordance with one or more aspects of the present invention. In this configuration, multiple optical waveguides 310 are disposed substantially coplanar within the waveguide link 203, and are surrounded by a cladding 312. The result is a laminated ribbon waveguide, which may be manufactured in bulk. This waveguide advantageously represents a minimum skew, maximum strength, and the smallest cable size. As illustrated in FIG. 3D, the first and/or second ends of the individual optical waveguides 310 may be exposed by truncating cladding 312 at either the first or second end thereof to provide flexibility for alignment and strain relief, as well as improved bend radius in coupling the individual optical waveguides to the respective light sources or photo-detectors.

Figure 3E:
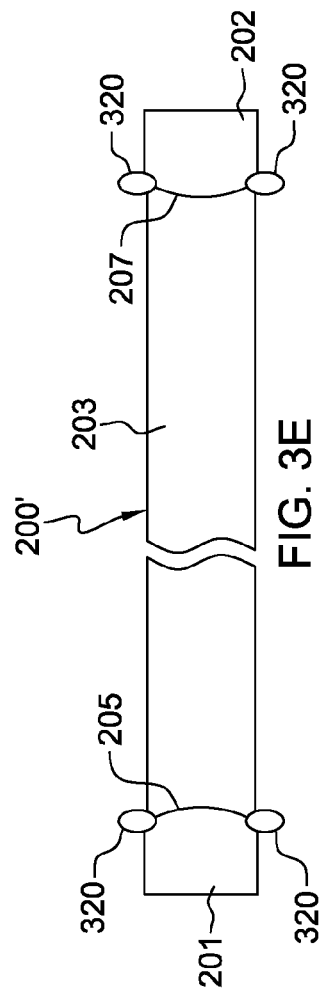
FIG. 3E depicts the interconnect component of FIG. 3A, with optional strain relief bond pads illustrated, in accordance with one or more aspects of the present invention.

As an optional enhancement, FIG. 3E depicts the interconnect component 200' of FIG. 3A, with multiple strain relief bond pads 320 provided, for instance, near the end points of the optical waveguide. For example, strain relief bond pads 320 may be provided on the end facets of the optical waveguide link to provide mechanical strain relief to the interconnect component relative to the electronic assembly. Further, in one embodiment, epoxy material could be provided to tack down long runs of the active waveguide link, or an overcoat could be provided over the optical waveguide link to, for instance, facilitate solder bond pad attachment of the optical waveguide link at intermediate points to the electronic assembly.

Numerous advantages are provided by an interconnect component such as described above in connection with FIGS. 2A-3E. For instance, in accordance with the above discussion, there is no need to clean optical interfaces since the optoelectronic interconnect structure is preassembled. This improves reliability, simplifies maintenance, reduces or eliminates back reflection due to transmitter/fiber coupling, allows active waveguide rework, and assembly at the final steps of an electronic assembly manufacturing process, and enables lower transmitter/receiver optical power coupling by eliminating variability of the optical connector. The interconnect component is inherently lead-free, and is immune to electrical noise, that is, except for the optoelectronic end points, which are more readily shielded or addressed. The connector disclosed herein is compatible with existing application-specific integrated circuit (ASIC) and backplane design tools, fabrication methods, and materials, and facilitates relaxed constraints on placement of active waveguide components. Still further, lower cost is achieved by avoiding a requirement for multi-fiber optical connectors. In particular, the connector disclosed herein avoids high-cost components, and no connector variability allows for lower optical power levels to be used, and hence, enables use of lower cost light sources or lasers, and thus saves power. Further, component fabrication using standard high-volume batch processing and waveguide molding techniques, unlike manual assembly required for glass fibers, further lowers cost. There is no interoperability requirement between the transmitters and receivers, which relaxes industry standard specifications, and allows sorting of transmitters and receiver repairs to improve yield. Lower power consumption is achieved, in part, by providing very short length optical waveguide links, equalization, and molded transmitter and/or receiver interfaces. The connector disclosed is suitable for battery-powered applications, including cell phones, personal digital assistants, etc., as well as for large computing systems, including server systems.

Again, the interconnect component disclosed herein allows for placement of the prefabricated or preassembled component as a final or near-final step in the manufacturing process of the electronic assembly, and also allows for the rework of the interconnect component, similar to other components placed within the electronic assembly. Because there is, in one example, a permanent attachment between the optoelectronic circuits and the waveguide link, there is no tolerance issue associated with otherwise plugging an optical connector, which improves reliability and makes the interconnect component budget more deterministic. Further, testing of the interconnect component as a sub-assembly is greatly facilitated by its preassembly. There is no need to bring electrical power up to the component's bond pads. Further, in one embodiment, heat spreaders may be integrated with, for instance, the end points of the interconnect component, particularly in close proximity to the light sources or lasers. This would facilitate optimization of the thermal budge of the component. In one implementation, such a heat spreader could be shared with one or more adjacent chip components.

Advantageously, a single narrow waveguide link could be employed to replace a much wider electrical bus with multiple lines. The interconnect component disclosed herein could be readily extended to an array of interconnect components which do not consume significantly more space. A built-in, self-test electrical wrap function, described below, may be added at either end of the interconnect component, that is, in either the first or second optoelectronic circuit to (for instance) isolate its operation from the rest of the electronic assembly, thus facilitating making the interconnect component a field-replaceable unit. Still further, the interconnect component could be reworked or replaced since, in one embodiment, it is possible to trade off sub-optimal light sources or lasers or receivers for improved-performing lasers or receivers within the optoelectronic circuits, thus allowing interconnect components to be repaired and improving overall yield.

Still further, proposed hereinbelow is the use of limiting amplifiers in association with the photo-detectors, and optionally, a programmable equalization function to, for instance, compensate for different lengths of electrical lines of the electronic assembly attaching to the interconnect component.

By way of further explanation, FIGS. 4A-4D depict example embodiments of the first and second optoelectronic circuits of the interconnect component.

Figure 4A:
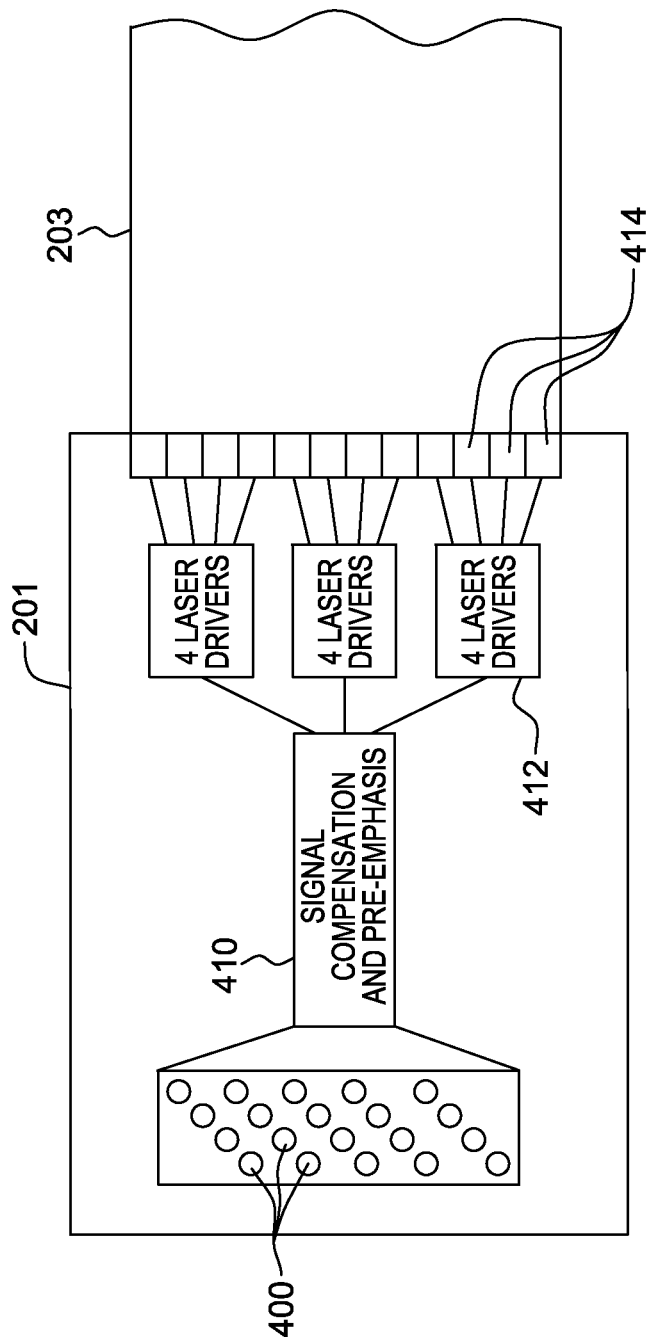
FIG. 4A is a schematic of one embodiment of a first optoelectronic circuit attached to a first end of an optical waveguide link of an interconnect structure, in accordance with one or more aspects of the present invention.

Referring first to FIG. 4A, as one embodiment of first optoelectronic circuit 201 is shown attached (for instance, permanently attached) to optical waveguide link 203, which in one embodiment may comprise a ribbon-type optical waveguide link. As shown, a first plurality of electrical contacts 400, such as a ball grid array of electrical input contacts, is associated with or integrated with first optoelectronic circuit 201. Electrical signals are received from, for instance, a first component of the electronic assembly, at the first plurality of electrical contacts 400, and forward to a signal compensation and pre-emphasis circuit 410, which conditions the electrical signals by processing the raw electrical signals to, for instance, modulate the downstream light sources or lasers more efficiently. By way of example, the signal compensation and pre-emphasis circuit may be configured by one of ordinary skill in the art to shift electrical signal levels so that they are in a range which the downstream lasers can better respond to, or may include capacitors to filter excess AC noise from the electrical signals and/or adjust signal amplitudes so as not to over-drive the downstream lasers. In this embodiment, the signal compensation and pre-emphasis circuit 410 provides the conditioned electrical signals to respective drivers 412, such as respective sets of vertical-cavity, surface-emitting laser (VCSEL) drivers. In this example, the VCSEL drivers 412 drive respective VCSEL lasers 414. Note that this embodiment of FIG. 4A is depicted by way of example only, and that numerous variations are possible. For instance, more than 12 lasers could be employed dependent, for instance, on the number of optical waveguides (or optical fibers or channels) within the optical waveguide link of the interconnect component.

Figure 4B:
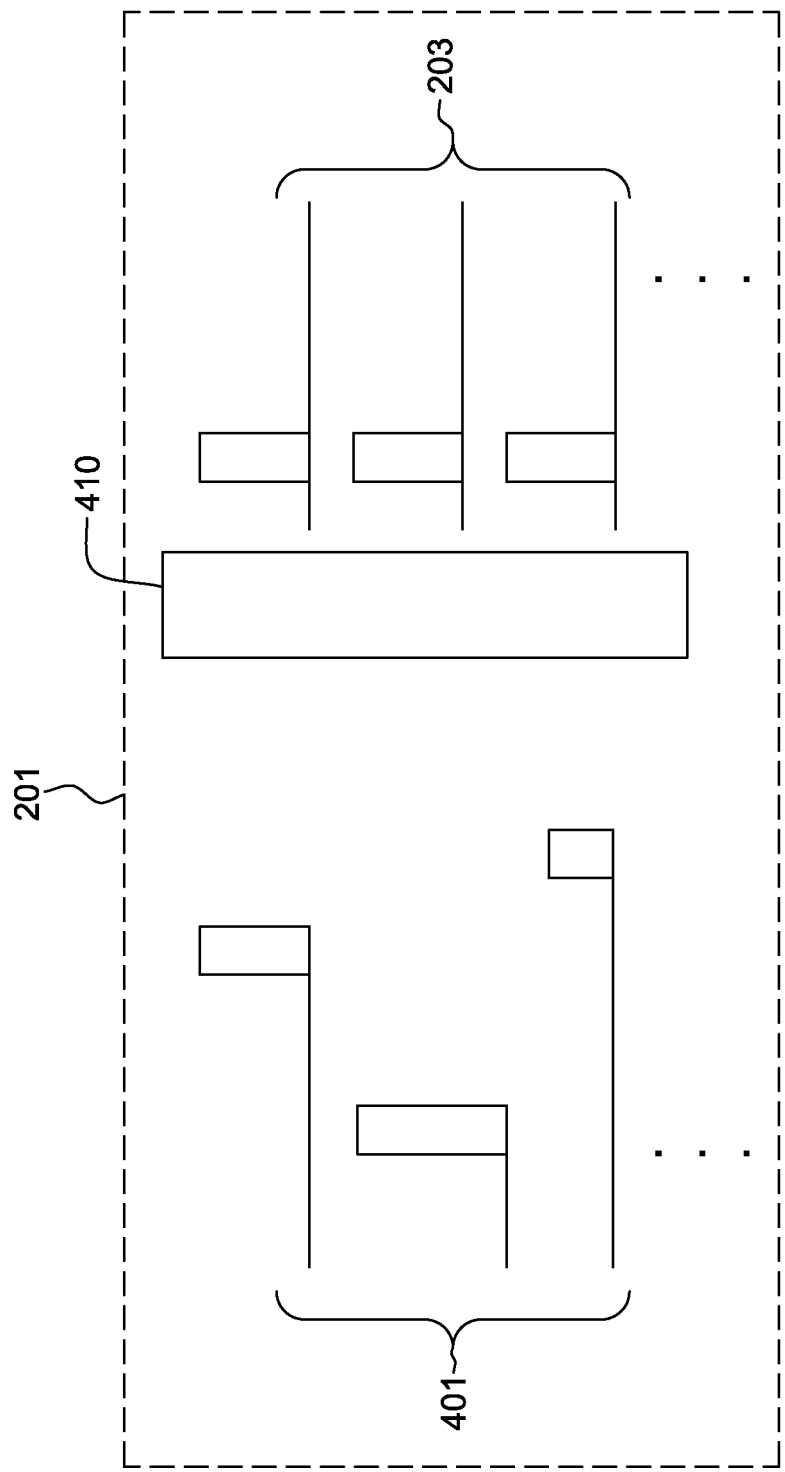
FIG. 4B depicts one embodiment of operation of the signal compensation and pre-emphasis circuit of the first optoelectronic circuit of FIG. 4A, in accordance with one or more aspects of the present invention.

FIG. 4B depicts one example of the operation of a signal compensation and pre-emphasis circuit 410 for an optoelectronic circuit 201 such as described above in connection with FIG. 4A. As illustrated, multiple electrical signals 401 may be received on different electrical contacts of the first plurality of electrical contacts 400 associated with first optoelectronic circuit 201. These electrical signals 401 are conditioned by the signal compensation pre-emphasis circuit 410 to present a more uniform drive signal 402 to, for instance, the downstream light source drivers of the optoelectronic circuit. In one embodiment, the signal compensation and pre-emphasis circuit 410 is an I2C-enabled electrical wrap circuit that provides compensation where, for example, electrical signal strength varies per channel due, for instance, to practical constraints on the length of the respective electrical channels. The signal compensation and pre-emphasis circuit may, in one embodiment, also be configurable by an end user via an I2C interface to the end points of the interconnect component. This might allow lower power operation of the light sources, such as lasers, and also facilitate the built-in self-test (i.e., electrical wrap at the end points) to isolate any failing components.

Figure 4C:
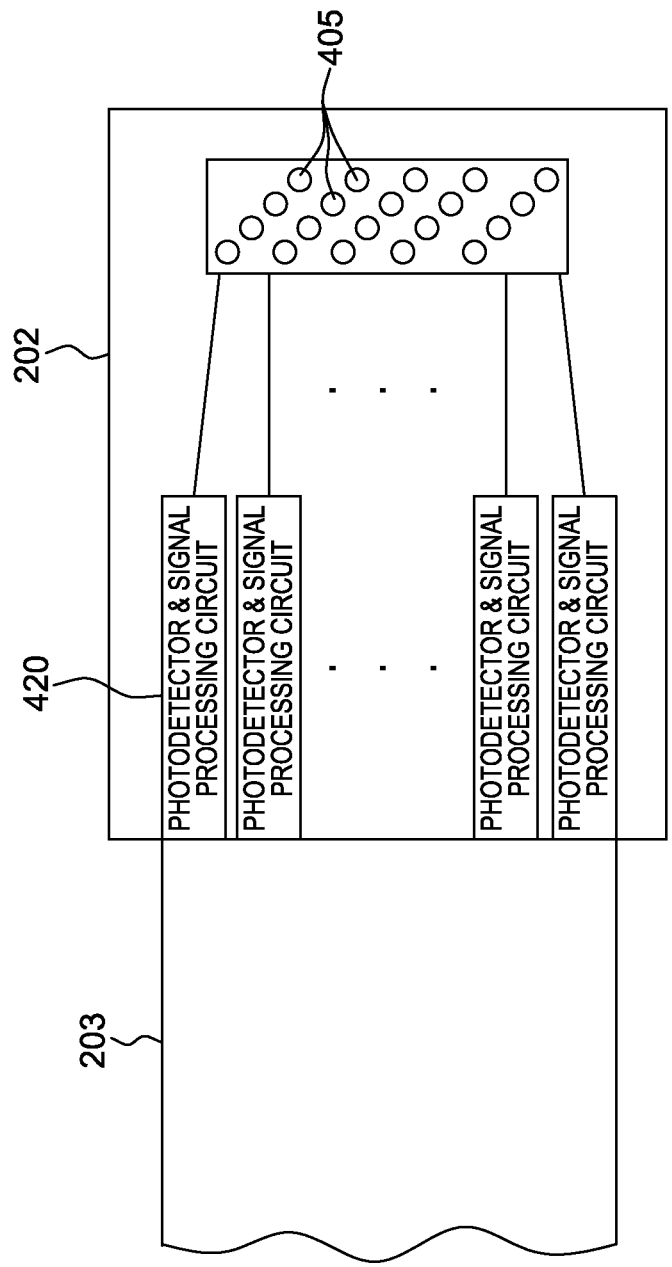
FIG. 4C is a schematic of one embodiment of a second optoelectronic circuit attached to a second end of an optical waveguide link of an interconnect component, in accordance with one or more aspects of the present invention.

FIG. 4C depicts one embodiment of a second optoelectronic circuit 202 attached (for instance, permanently attached) to an opposite end of optical waveguide link 203. In this embodiment, second optoelectronic circuit 202 comprises multiple parallel-coupled photo-detector and signal processing circuits disposed between the optical waveguide link 203 and a second plurality of electrical contacts 405, such as ball grid array of electrical output contacts associated with or part of the optoelectronic circuit 202. In operation, the photo-detector and signal processing circuits receive optical signals from respective optical waveguides of the optical waveguide link 203 and convert and condition the optical signals into electrical signals for output via the second plurality OF electrical contacts 405.

Figure 4D:
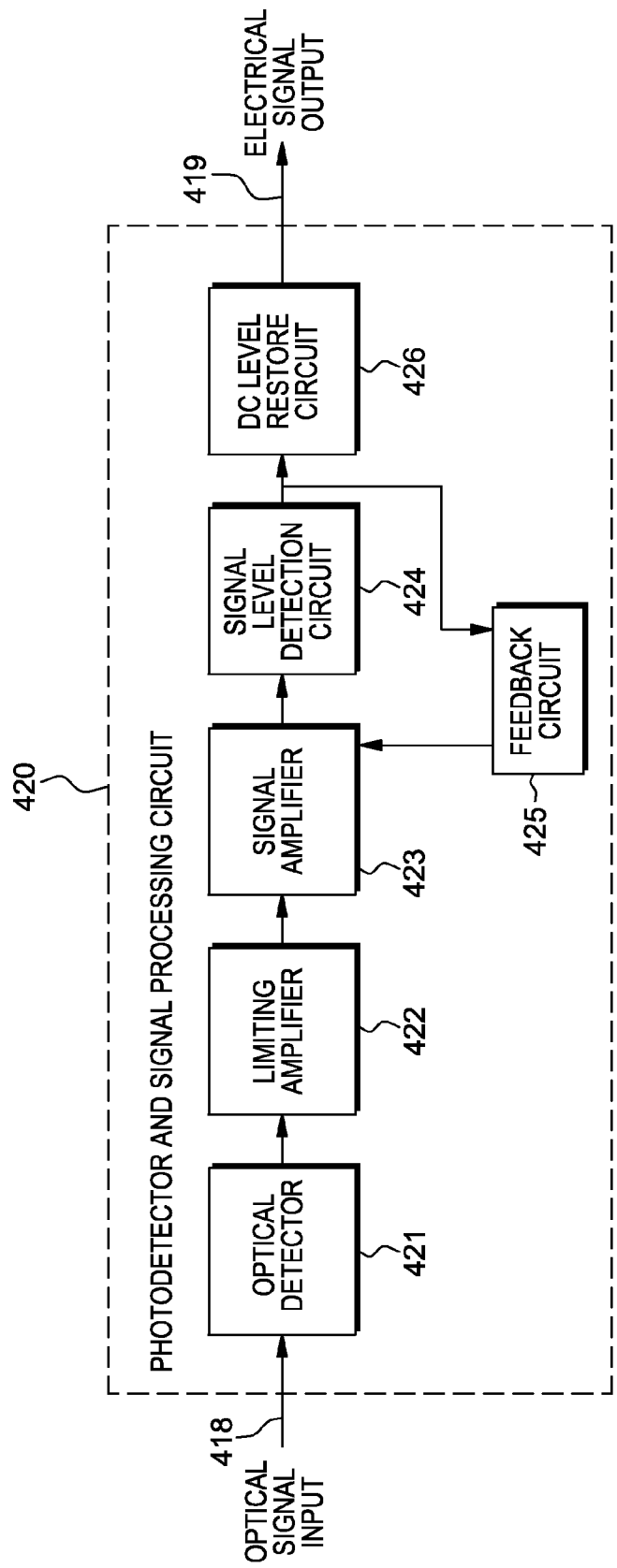
FIG. 4D is a schematic of one embodiment of a photo-detector and signal processing circuit of the second optoelectronic circuit of FIG. 4C, in accordance with one or more aspects of the present invention.

FIG. 4D depicts one embodiment of a photo-detector and signal processing circuits 420, which may be employed in second optoelectronic circuit 202 of an interconnect component such as disclosed herein. As illustrated, an optical signal 418 is received across an optical waveguide of the optical waveguide link by a photo-detector 421, which converts the light signal to an electrical signal and outputs the electrical signal to (in this example) a limiting amplifier 422. This limiting amplifier defines, in one embodiment, maximum and minimum signal levels, and may comprise a commercially available component. Advantageously, limiting amplifier 422, in combination with photo-detector 421, provides an upper clip level or maximum signal notwithstanding that an excessive light signal is received at the photo-detector.

A signal amplifier 423 at the output of limiting amplifier 422, in combination with a signal detection circuit 424 and a feedback circuit 425, may be provided to condition the obtained electrical signal into a common high signal level or common low signal level, that is, across the plurality of parallel-connected photo-detector and signal processing circuit of the second optoelectronic circuit. Advantageously, this circuitry may be designed to equalize the ranges of the resultant electrical signals across the associated channels, even through, for instance, one of the light sources or lasers is differently configured, sized, or performing differently from the others. Signal amplifier 423 provides the detection circuit with an electrical signal within a known range as an input, and the detection circuit 424 includes a threshold level to either detect a signal high or signal low electrical signal. Feedback circuit 425, which again, may be separately provided within each photo-detector and signal processing circuit, facilitates equalization across the photo-detectors notwithstanding that different detectors may have different gains. The feedback circuit allows dynamic variation in the signal amplification to ensure that the input signal to the detection circuit 424 stays within the desired range. The output of detection circuit 424 may require DC biasing via a DC-level resource circuit 426 so that an electrical signal 419 is output at the appropriate DC level for the second component, such as a PCI bus, of the electronic assembly to which the second optoelectronic circuitry is attached via the second plurality of electrical contacts. Note that the particular signal processing circuitry of FIG. 4D is presented herein by way of example only. Variations thereof may be implemented without departing from the scope of the claims presented herewith.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A system comprising:

a plurality of integrated circuit chips arranged in a stack;

a plurality of vertical electrical interconnects electrically connecting together the plurality of integrated circuit chips arranged in the stack, the plurality of vertical electrical interconnects extending, at least in part, through the plurality of integrated circuit chips in the stack;

another interconnect component, the another interconnect component comprising;

a preassembled optoelectronic interconnect structure electrically connected between a first integrated circuit chip and a second integrated circuit chip of the plurality of integrated circuit chips arranged in the stack, the preassembled optoelectronic interconnect structure comprising:

an optical waveguide link, the optical waveguide link having a first end and a second end, and extending, at least in part, vertically along an edge of the stack between the first integrated circuit chip and the second integrated circuit chip of the stack;

a first optoelectronic circuit attached to the first end of the optical waveguide link, and a second optoelectronic circuit attached to the second end of the optical waveguide link, the first and second optoelectronic circuits comprising active optical componentry facilitating, in part, optical signal communication across the optical waveguide link;

a first plurality of electrical contacts associated with the first optoelectronic circuit and a second plurality of electrical contacts associated with the second optoelectronic circuit, the first and second pluralities of electrical contacts electrically operatively connecting the preassembled optoelectronic interconnect structure to the first and second integrated, chips, respectively, in the stack; and wherein the another interconnect component provides addition interconnect to the stack along the edge of the stack to that provided by the plurality of vertical electrical interconnects extending through the stack.

2. The system of claim 1, wherein the preassembled optoelectronic interconnect structure electrically operatively connects between the first and second into grated circuit chips of the stack as a single field-replaceable unit.

3. The system of claim 1, wherein the optical waveguide link comprises at least one optical waveguide, the first optoelectronic circuit comprises at least one light source providing optical signals to the at least one optical waveguide at the first end of the optical waveguide link, and the second optoelectronic circuit comprises at least one photo-detector receiving the optical signals from the at least one optical waveguide at the second end of the optical waveguide link.

4. The system of claim 1, wherein the optical waveguide link comprises a plurality of optical waveguides, the first optoelectronic circuit comprises a plurality of light sources providing optical signals to the plurality of optical waveguides at the first end of the optical waveguide link, and the second optoelectronic circuit comprises a plurality of photo-detectors receiving the optical signals from the plurality of optical waveguides at the second end of the optical waveguide link.

5. The system of claim 4, wherein the optical waveguide link is sized and configured at the first end thereof to optimize optical power coupling between the plurality of light sources and the plurality of optical waveguides and at the second end thereof to optimize optical power coupling between the plurality of optical waveguides and the plurality of photo-detectors.

6. The system of claim 4, wherein the optical waveguide link comprises at least one optical waveguide with an aspect ratio at a first end thereof designed to match a light source overfill launch of at least one light source of the plurality of light sources.

7. The system of claim 6, wherein the at least one light source of the plurality of light sources comprises at least one vertical-cavity, surface-emitting laser (VCSEL) with an elliptical launch profile.

8. The system of claim 1, wherein the optical waveguide link comprises a plurality of optical waveguides, the plurality of optical waveguides being disposed substantially coplanar within the optical waveguide link.

9. The system of claim 1, wherein the optical waveguide link comprises a cladding surrounding at least one optical waveguide thereof, and wherein the cladding is recessed from the at least one optical waveguide at the first end and at the second end of the optical waveguide link to facilitate physical attachment of the at least one optical waveguide to the first optoelectronic circuit and to the second optoelectronic circuit at opposite ends thereof.

10. The system of claim 1, wherein the first optoelectronic circuit comprises a signal compensation and pre-emphasis circuit to reduce skew between electrical signals on the first plurality of electrical contacts, and facilitate uniformity in amplitude between optical signals transmitted from the first optoelectronic circuit into the optical waveguide link.

11. The system of claim 10, wherein the first optoelectronic circuit further comprises a plurality of sets of a series-coupled laser driver and a laser connected in parallel between the signal compensation and pre-emphasis circuit and the optical waveguide link.

12. The system of claim 11, wherein the lasers of the plurality of sets comprise a plurality of vertical-cavity, surface-emitting lasers (VCSELs).

13. The system of claim 1, wherein the second optoelectronic circuit comprises at least one photo-detector and at least one limiting amplifier electrically coupled thereto and limiting amplitude of signals obtained via the at least one photo-detector, and wherein the optical waveguide link comprises an interconnect link length of 100 centimeters or less between the first and second optoelectronic circuits.

14. The system of claim 1, wherein the second optoelectronic circuit comprises a plurality of sets of a series-coupled photo-detector and a signal processing circuit coupled in parallel between the optical waveguide link and the second plurality of electrical contacts, each set of series-coupled photo-detector and signal processing circuit independently adjusting amplitude of output signals thereof between a common high signal level and a common low signal level.

15. The system of claim 1, wherein the preassembled optoelectronic interconnect structure further comprises multiple strain relief bond pads which facilitate coupling the preassembled optoelectronic interconnect structure to the stack, the multiple strain relieve bond pads being larger than the electrical contacts of the first and second pluralities of electrical contacts.

* * * * *